United States Patent
Kameshima et al.

(10) Patent No.: US 9,645,259 B2
(45) Date of Patent: May 9, 2017

(54) RADIATION IMAGE PICKUP APPARATUS, RADIATION IMAGE PICKUP SYSTEM, METHOD FOR CONTROLLING RADIATION IMAGE PICKUP APPARATUS, AND PROGRAM

(71) Applicant: CANON KABUSHIKI KAISHA, Tokyo (JP)

(72) Inventors: Toshio Kameshima, Kumagaya (JP); Tomoyuki Yagi, Honjo (JP); Katsuro Takenaka, Honjo (JP); Sho Sato, Saitama (JP); Atsushi Iwashita, Saitama (JP); Eriko Sato, Tokyo (JP); Hideyuki Okada, Honjo (JP); Takuya Ryu, Kokubunji (JP); Kosuke Terui, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 14/207,008

(22) Filed: Mar. 12, 2014

(65) Prior Publication Data

US 2014/0264060 A1    Sep. 18, 2014

(30) Foreign Application Priority Data

Mar. 15, 2013    (JP) .................................. 2013-053597

(51) Int. Cl.
*G01T 1/24* (2006.01)
*H01L 27/146* (2006.01)
*H04N 5/32* (2006.01)

(52) U.S. Cl.
CPC ............ *G01T 1/247* (2013.01); *H01L 27/146* (2013.01); *H04N 5/32* (2013.01)

(58) Field of Classification Search
CPC .......... G01T 1/247; H04N 5/32; H01L 27/146
See application file for complete search history.

(56) References Cited

U.S. PATENT DOCUMENTS

| | | | | |
|---|---|---|---|---|
| 2002/0044211 A1* | 4/2002 | Tujii | ..................... | G01T 1/2928 348/302 |
| 2004/0258204 A1* | 12/2004 | Nokita | ..................... | A61B 6/00 378/91 |

(Continued)

FOREIGN PATENT DOCUMENTS

| JP | 2002165142 A | 6/2002 | | |
|---|---|---|---|---|
| JP | WO 2011027538 A1 * | 3/2011 | ............... | A61B 6/00 |

(Continued)

*Primary Examiner* — David Porta
*Assistant Examiner* — Jeremy S Valentiner
(74) *Attorney, Agent, or Firm* — Canon USA Inc., IP Division

(57) ABSTRACT

A radiation image pickup apparatus includes a pixel array including a plurality of pixels arranged in a matrix and configured to convert a radiant ray into electric signals, signal processors configured to output digital signals obtained in accordance with the electric signals output from the pixel array in parallel, and a controller configured to operate the signal processors after the signal processors enter a second power consumption state in which power consumption is higher than that of a first power consumption state from the first power consumption state after irradiation of a radiant ray to the pixel array is terminated, and to cause the signal processors to output digital signals after the signal processors are operated.

20 Claims, 13 Drawing Sheets

(56) References Cited

U.S. PATENT DOCUMENTS

| | | | | |
|---|---|---|---|---|
| 2011/0095169 A1* | 4/2011 | Takenaka | ............... | H04N 5/378 250/208.1 |
| 2011/0147601 A1* | 6/2011 | Niekawa | .............. | A61B 6/4233 250/370.09 |
| 2011/0317809 A1* | 12/2011 | Eguchi | ................. | A61B 6/4233 378/62 |
| 2012/0006993 A1* | 1/2012 | Arishima | ................. | H04N 5/32 250/369 |
| 2012/0075507 A1* | 3/2012 | Yamazaki | ................ | H04N 5/32 348/241 |
| 2012/0199749 A1* | 8/2012 | Kameshima | ............. | A61B 6/00 250/370.08 |
| 2012/0280131 A1* | 11/2012 | Spartiotis | ................ | G01T 1/247 250/366 |
| 2012/0299804 A1* | 11/2012 | Senda | .................... | H04N 5/374 345/55 |
| 2013/0082166 A1* | 4/2013 | Sugawara | ................ | H04N 5/32 250/208.1 |
| 2013/0105701 A1* | 5/2013 | Han | ........................ | G01T 1/247 250/394 |

FOREIGN PATENT DOCUMENTS

| | | | |
|---|---|---|---|
| JP | 2011-101693 A | 5/2011 | |
| JP | 2012204964 A | 10/2012 | |
| JP | 2012-244607 A | 12/2012 | |
| WO | 2010/073894 A1 | 7/2010 | |

* cited by examiner

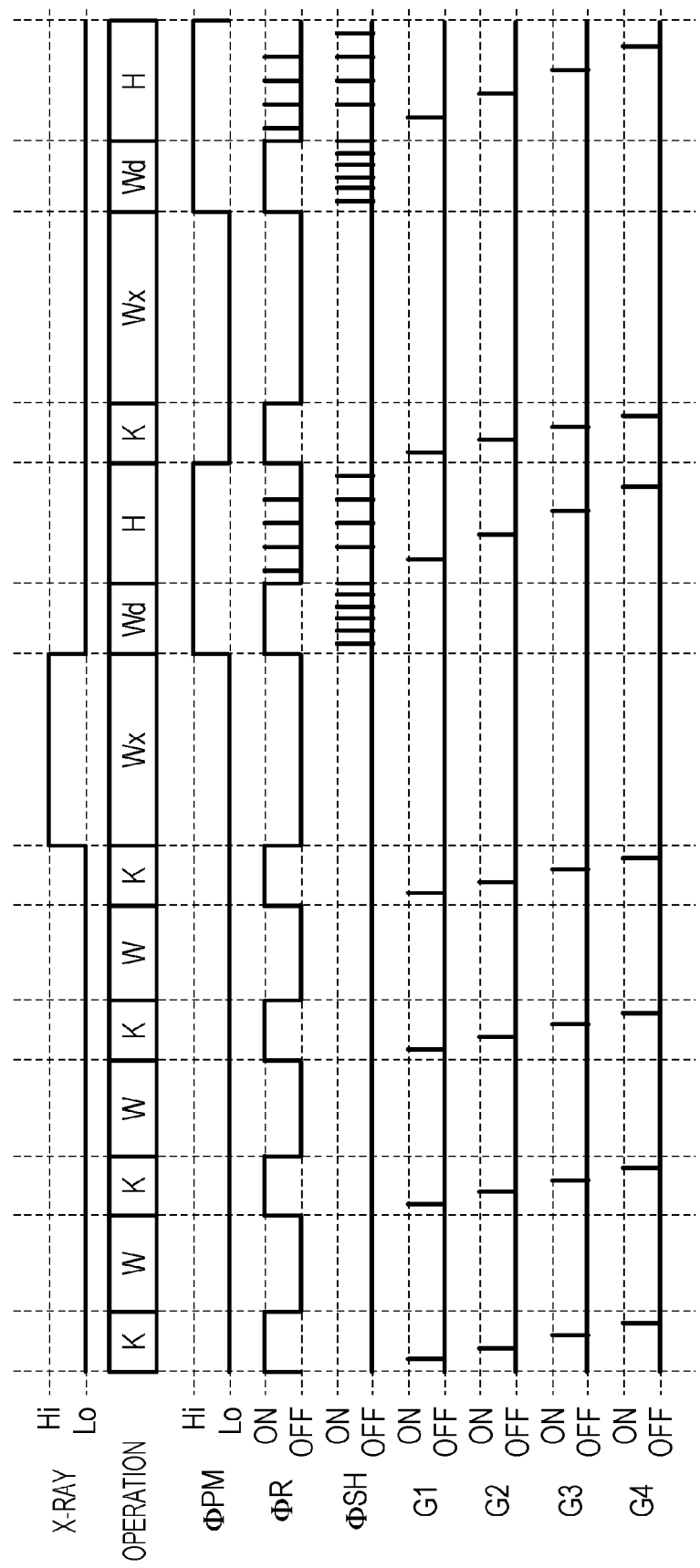

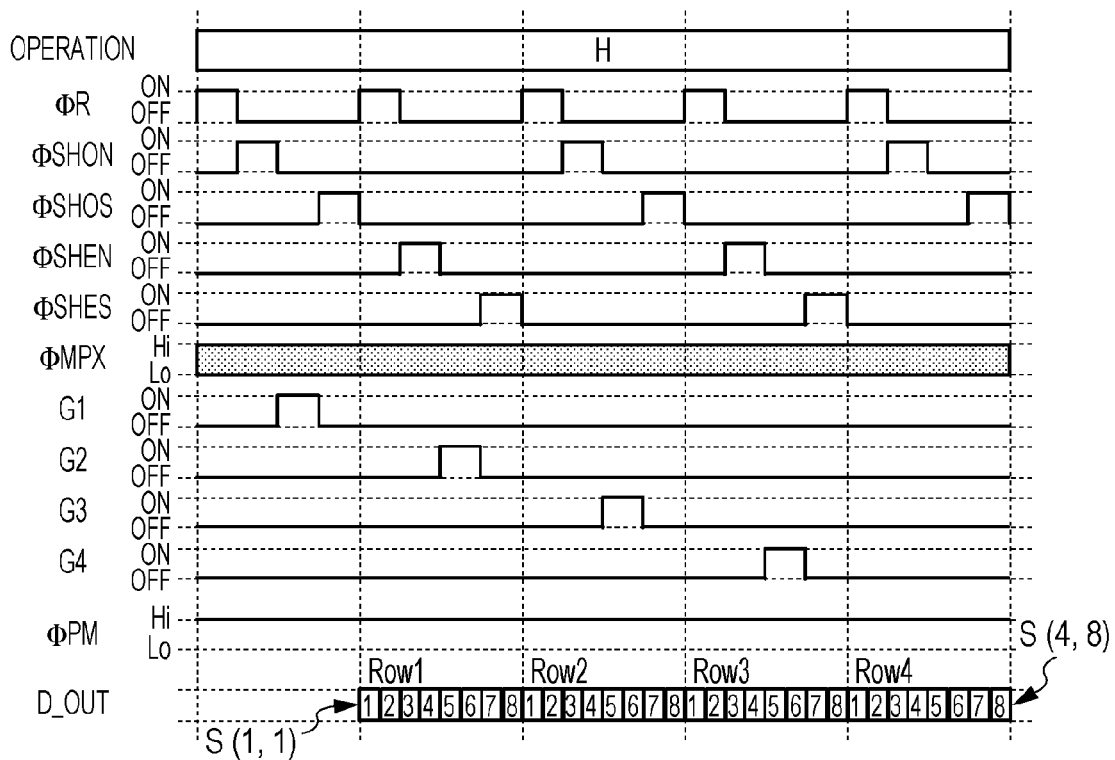
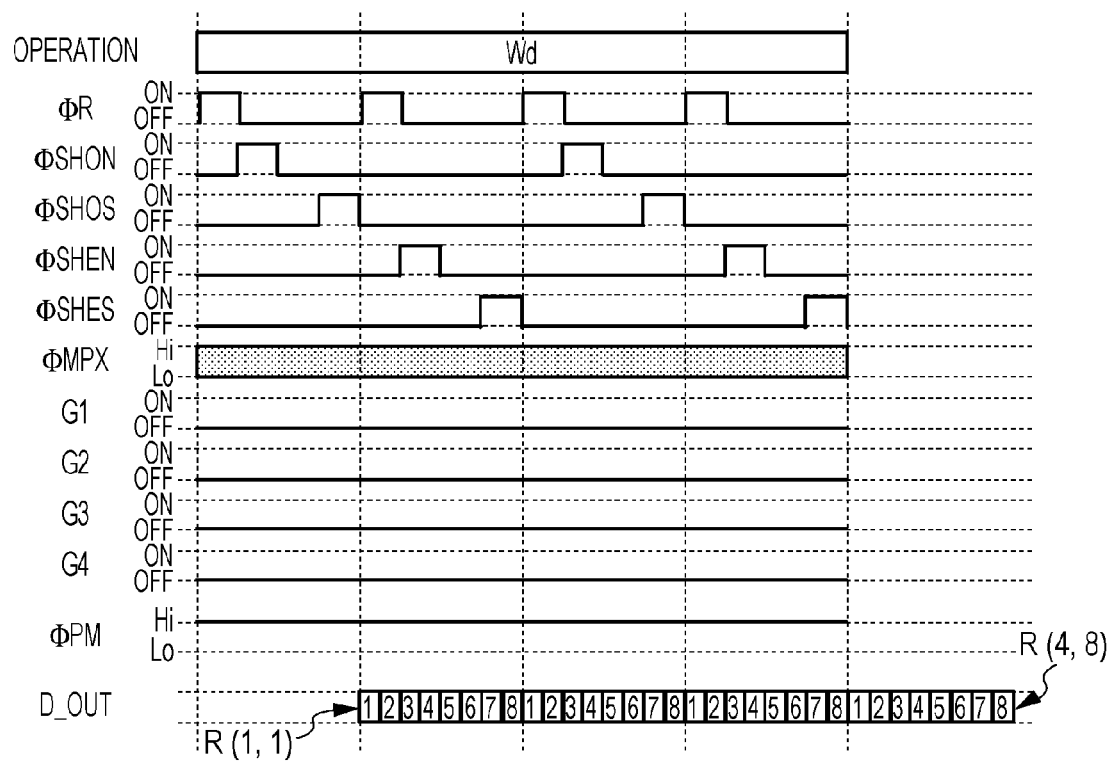

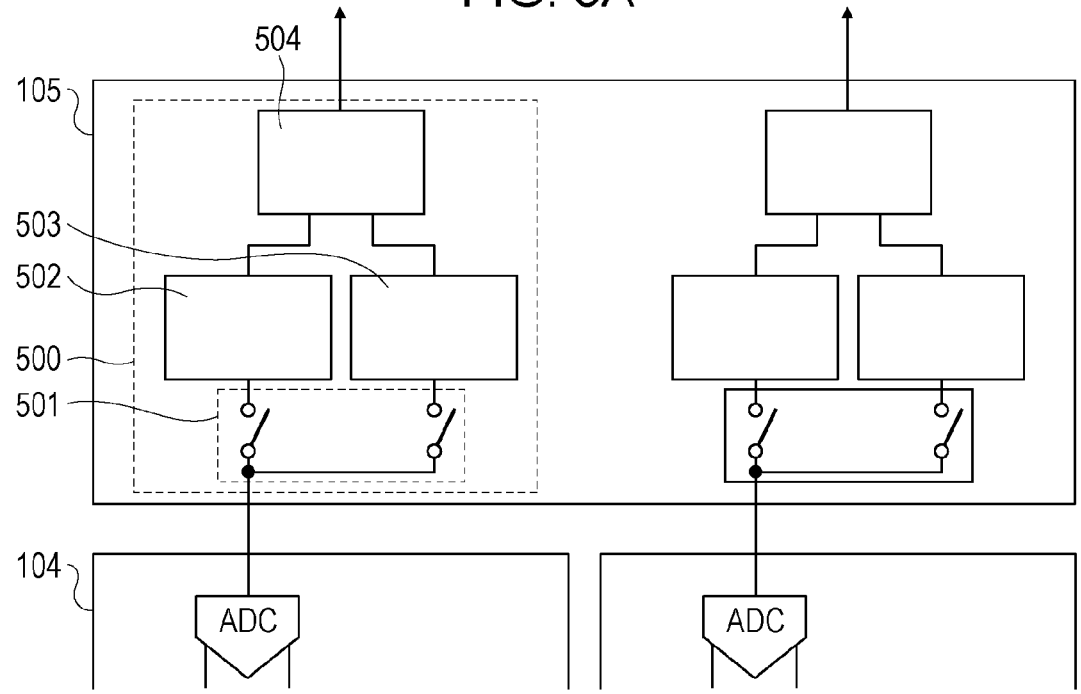

FIG. 6A, FIG. 6B, FIG. 6C, FIG. 6D, FIG. 6E, FIG. 6F, FIG. 6G

RADIATION IMAGE PICKUP APPARATUS, RADIATION IMAGE PICKUP SYSTEM, METHOD FOR CONTROLLING RADIATION IMAGE PICKUP APPARATUS, AND PROGRAM

BACKGROUND OF THE INVENTION

Field of the Invention

The present invention relates to a radiation image pickup apparatus and a radiation image pickup system which are considered useful for medical diagnosis and an industrial non-destructive testing, a method for controlling the radiation image pickup apparatus, and a program.

Description of the Related Art

A radiation image pickup apparatus includes a pixel array disposed in a two-dimensional matrix form. The pixel array includes pixels which convert a radiant energy (radiant rays) into electric signals. A signal processor outputs digital signals based on the electric signals of the pixels, and a power supply unit supplies voltages to the pixel array and the signal processor. Japanese Patent Application Laid-Open No. 2002-165142 discloses a power-saving configuration in which a power supply unit includes a first power source which supplies a voltage to a pixel array and a second power source which supplies an operating voltage to a signal processor and a controller controls the power supply unit so that the first and second power sources are individually controlled. Furthermore, Japanese Patent Laid-Open No. 2002-165142 discloses a technique of supplying an operating voltage from the second power source to the signal processor after irradiation of a radiant ray to the pixel array is completed and outputting digital signals from the signal processor when a predetermined period of time is elapsed after the signal processor receives the operating voltage from the second power source.

However, when the method disclosed in Japanese Patent Laid-Open No. 2002-165142 is used, although the power saving is attained, artifact may be generated in an image obtained by a radiation image pickup apparatus in accordance with digital signals output from the signal processor. The artifact may be generated when a voltage applied to elements in the signal processor has not reached a desired value even when a predetermined period of time has elapsed after an operating voltage source is supplied to the signal processor. On the other hand, if the predetermined period of time is set long so that a voltage applied to the elements included in the signal processor attains the desired value, a period of time from when the irradiation of a radiant ray is completed to when an image is obtained becomes long.

SUMMARY OF THE INVENTION

The present invention provides a radiation image pickup apparatus which attains power saving, suppression of artifact of an obtained image, and reduction of a period of time from when irradiation of a radiant ray is terminated to when the image is obtained. The radiation image pickup apparatus according to the present invention includes a pixel array including a plurality of pixels arranged in a matrix and configured to convert a radiant ray into electric signals, signal processors configured to output digital signals obtained in accordance with the electric signals output from the pixel array in parallel, and a controller configured to operate the signal processors after the signal processors enter a second power consumption state in which power consumption is higher than that of a first power consumption state from the first power consumption state after irradiation of a radiant ray to the pixel array is terminated, and to cause the signal processors to output digital signals after the signal processors are operated.

According to the present invention, a radiation image pickup apparatus which attains power saving, suppression of artifact of an obtained image, and reduction of a period of time from when irradiation of a radiant ray is terminated to when the image is obtained may be provided.

Further features of the present invention will become apparent from the following description of exemplary embodiments with reference to the attached drawings.

BRIEF DESCRIPTION OF THE DRAWINGS

FIG. 2 is a timing chart illustrating operations of the radiation image pickup apparatus according to the exemplary embodiment.

FIGS. 3A to 3C are timing charts illustrating operations of the radiation image pickup apparatus according to the exemplary embodiment.

FIG. 5A is a diagram schematically illustrating an additional configuration of the radiation image pickup apparatus according to the exemplary embodiment, and FIGS. 5B and 5C are diagrams illustrating examples of image processing performed by the radiation image pickup apparatus according to the exemplary embodiment.

FIGS. 6A to 6G are diagrams schematically illustrating modifications of the image processing performed by the radiation image pickup apparatus according to the exemplary embodiment.

DESCRIPTION OF THE EMBODIMENTS

Figure 1A:
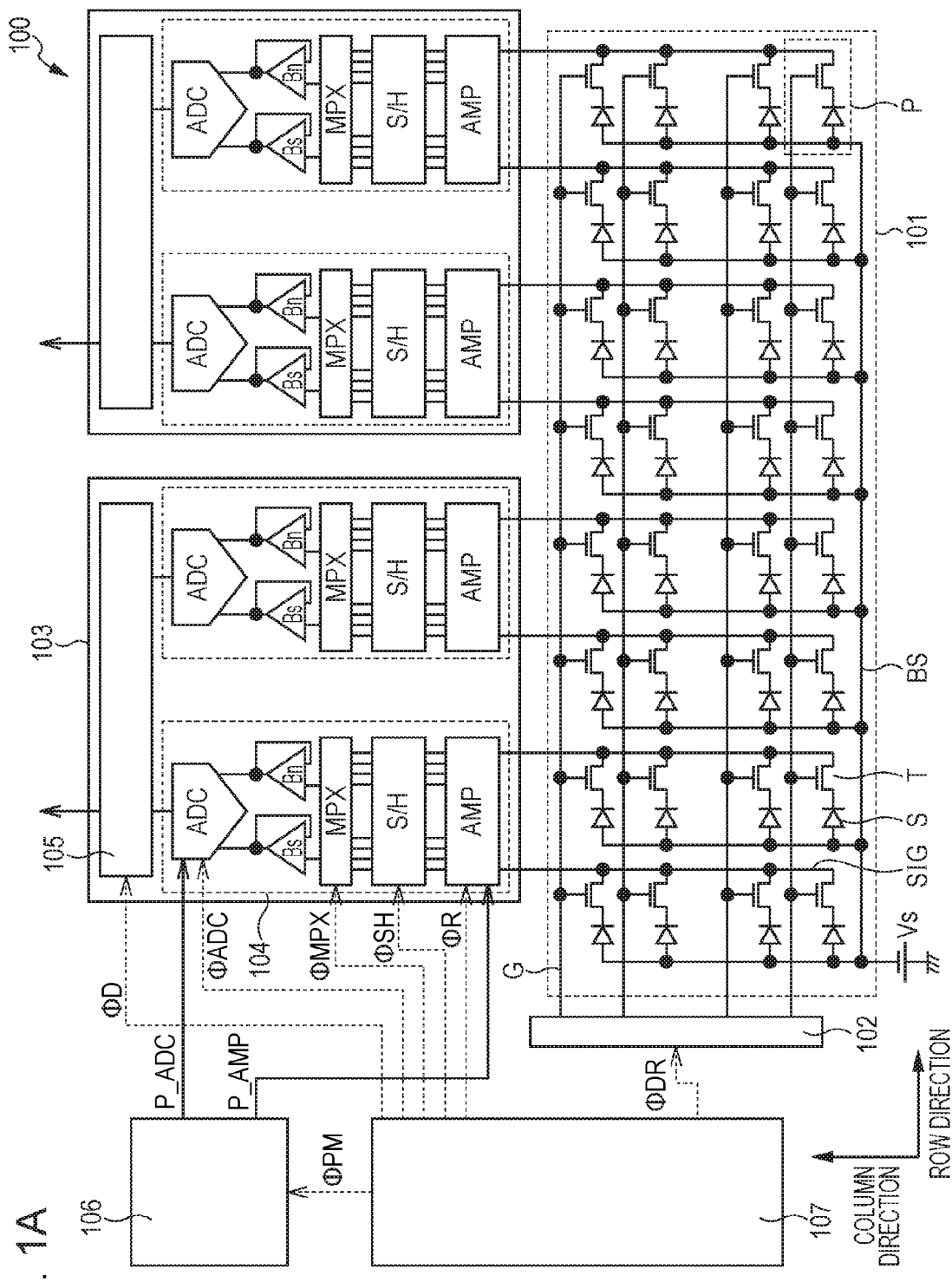
FIGS. 1A and 1B are equivalent circuit diagrams illustrating a configuration of a radiation image pickup apparatus according to an exemplary embodiment.

Hereinafter, exemplary embodiments of the present invention will be described in detail with reference to the accompanying drawings. The same reference numerals are assigned to the same components included in various exemplary embodiments and redundant descriptions thereof are omitted. Furthermore, the exemplary embodiments may be modified and combined with each other where appropriate. As used in this application, a radiant ray (or radiant energy) may correspond to an X ray, an $\alpha$ ray, a $\beta$ ray, or a $\gamma$ ray.

A configuration of a radiation image pickup apparatus 100 according to an exemplary embodiment of the present invention will be described with reference to FIG. 1A. The radiation image pickup apparatus 100 is configured such that an image formed by a radiant ray is captured. An image may be formed by a radiant ray which is radiated from a radiation source, such as an X-ray tube (not illustrated), and which transmits through a subject.

The radiation image pickup apparatus 100 includes an pixel array 101, a driving unit 102, signal processors 103 each of which has readout circuits 104 and a digital signal processing circuit 105, a power source unit 106, and a controller 107.

The pixel array 101 has a plurality of pixels P arranged in a two-dimensional form having a plurality of rows and a plurality of columns. Although the pixels P is arranged in a matrix of four rows and eight columns in an example of FIG. 1A, pixels P are arranged as many as possible so as to constitute rows and columns as many as possible in practice. For example, a radiation image pickup apparatus having a size of 35 cm×43 cm has pixels in a matrix of approximately 2800 rows and approximately 3400 columns. Each of the pixels P includes a conversion element S which converts a radiant ray into electric charge and a switch element T which outputs the electric charge or an electric signal corresponding to the electric charge to a corresponding one of signal lines SIG.

The conversion element S may be an indirect conversion element including a photoelectric conversion element which converts light into electric charge and a wavelength conversion element (scintillator) which converts a radiant ray into a light beam having a wavelength detectable by the photoelectric conversion element, for example. Alternatively, the conversion element may be a direct conversion element which directly converts a radiant ray into electric charge. In FIG. 1A, an indirect conversion element is used which includes a photoelectric conversion element corresponding to a PIN photodiode which is mainly formed by amorphous silicon and which is disposed on an insulating substrate such as a glass substrate, for example.

The switch element T may be a transistor, such as a thin-film transistor (TFT), which includes a control terminal and two main terminals. One electrode of the conversion element S is electrically connected to one of the two main terminals of the switch element T and the other electrode of the conversion element S is electrically connected to a common bias line BS. A bias potential is supplied to the bias line BS from a bias power source Vs.

A control terminal (gate) of the switch element T is connected to a corresponding one of driving lines G to which a conductive voltage and a non-conductive voltage may be supplied from the driving unit 102. The driving unit 102 supplies a conductive voltage to a driving line G corresponding to a selected row included in the pixel array 101. When the conductive voltage is supplied to the gate of the switch element T through a corresponding one of the driving lines G, the switch element T is brought to a conductive state. By this, signals corresponding to electric charges accumulated in conversion elements S included in pixels P of the selected row are output to a plurality of signal lines SIG. In this way, the driving unit 102 drives the pixel array 101.

The parallel signals output to the signal lines SIG in parallel are read by the readout circuits 104 included in the signal processors 103. The parallel signals are subjected to amplification, sampling and holding (S/H), correlated double sampling (CDS), parallel/serial conversion (MPX), and the like performed by the readout circuits 104 and converted into serial digital signals. The digital signals output from the readout circuits 104 may be subjected to a desired digital signal process performed by the digital signal processing circuit 105 before being output from the digital signal processing circuit 105. Examples of the desired digital signal process may include a digital signal parallel/serial conversion (digital multiplex) process when the plurality of readout circuits 104 are provided as illustrated in FIG. 1A. By this operation, the signal processors 103 output digital signals in accordance with the electric signals of the pixels P. Each of the signal processors 103 may include the plurality of readout circuits 104 and the digital signal processing circuit 105. Each of the readout circuits 104 includes an amplification unit AMP including a plurality of amplification circuits corresponding to the signal lines SIG, an S/H unit including a plurality of S/H circuits corresponding to the amplification circuits, and a multiplexer unit (MPX unit) including a plurality of switches corresponding to the S/H circuits. Each of the readout circuits 104 further includes Buffer amplifiers Bs and Bn which perform buffer output of serial analog signals supplied from the MPX unit and an A/D converter ADC which converts the serial analog signals output from the buffer amplifiers so as to output digital signals. Furthermore, the radiation image pickup apparatus 100 may include the plurality of signal processors 103 so as to process parallel signals output from the pixel array 101. The signal processors 103 will be described in detail hereinafter with reference to FIG. 1B.

The power source unit 106 supplies operating voltages to the components included in the signal processors 103. In FIG. 1A, the power source unit 106 supplies an operating voltage P_AMP to the amplification units AMP and an operating voltage P_ADC to the A/D converters ADC. The power source unit 106 may further supply a reference voltage to the amplification units AMP, a reference voltage to the A/D converters ADC, and a constant voltage to the S/H circuits.

The controller 107 may control the signal processors 103 and the power source unit 106. In FIG. 1A, the controller 107 supplies control signals ΦR, ΦSH, ΦMPX, ΦADC, and ΦD to the signal processors 103 so as to control the signal processors 103. Here, the control signal ΦR is supplied to the amplification units AMP, the control signal ΦSH is supplied to the S/H units, the control signal ΦMPX is supplied to the MPX units, and the control signal ΦADC is supplied to the A/D converters ADC. Furthermore, the control signal ΦD is supplied to the digital signal processing circuits 105. The controller 107 also supplies a control signal ΦPM to the power source unit 106 so as to control the power source unit 106. Furthermore, the controller 107 supplies a control signal ΦDR to the driving unit 102 so as to control the driving unit 102. The controller 107 supplies the control signal ΦPM so as to instruct the power source unit 106 to supply an operating voltage to the signal processors 103 after irradiation of a radiant ray to the pixel array 101 is terminated. Specifically, in accordance with the control signal ΦPM, after the irradiation of a ray beam is terminated, the signal processors 103 enter a second power consumption state in which power consumption is higher than that of a first power consumption state from the first power consumption state. Thereafter, the controller 107 supplies the control signals ΦR, ΦSH, ΦMPX, ΦADC, and ΦD so as to control the signal processors 103 so that the signal processors 103 output digital signals when a predetermined period of time is elapsed after receiving the operating voltage. By this control, power saving is attained. Although the control signal ΦPM is supplied to the power source unit 106 in this exemplary embodiment, the present invention is not limited to this. The controller 107 may supply the control signal ΦPM to the signal processors 103 so that the signal processors 103 enter the second power consumption state in which power consumption is higher than that of the first power consumption state from the first power consumption state when the irradiation of a ray beam is terminated.

In the radiation image pickup apparatus 100 configured such that parallel signals output from the pixel array 101 are processed in parallel by the plurality of components, artifact is generated in an image obtained by the radiation image pickup apparatus 100. This may be because states of the operating voltages supplied to the components which process the parallel signals output from the pixel array 101 in parallel and values of the operating voltages vary depending on the components. In particular, in the radiation image pickup apparatus 100 including the plurality of A/D converters ADC, if states of the operating voltages supplied to the A/D converters ADC and values of the operating voltages vary, digital conversion characteristics of the A/D converters ADC may be considerably different from one another. Consequently, artifact is generated in an image obtained by the radiation image pickup apparatus 100. The artifact of an image is suppressed when states of the operating voltages supplied to the components which perform parallel processing on parallel signals output from the pixel array 101 and values of the operating voltages become desired states and desired values. Therefore, artifact of an image for correction which is obtained in the desired states and the desired values is suppressed, and correction of the artifact is difficult to be performed by a correction process using the image for correction.

When the artifact is examined in this case, it is found that artifact of an obtained image is suppressed by operating the signal processors 103 within a predetermined period of time after the signal processors 103 enter the second power consumption state in which power consumption is higher than that of the first power consumption state from the first power consumption state. This may be because, when the signal processors 103 are operated, variation among the states of the operating voltages supplied to the components which perform parallel processing on the parallel signals output from the pixel array 101 and variation among values of the operating voltages are reduced. When the signal processors 103 reduce the variation among the supply states of the operating voltages and the variation among the values of the operating voltages before outputting digital signals corresponding to a radiant ray, artifact generated in an obtained image is suppressed. In the radiation image pickup apparatus 100 including the plurality of signal processors 103, the signal processors 103 are preferably operated within a predetermined period of time. This is because the variation among the states of the operating voltages supplied to the signal processors 103 and the variation among the values of the operating voltages are suppressed. Furthermore, the predetermined period of time after the signal processors 103 enter the second power consumption state in which power consumption is higher than that of the first power consumption state from the first power consumption state is not required to be extended. Therefore, a period of time from when irradiation of a radiant ray is terminated to when an image is obtained may be reduced. According to the present invention, a radiation image pickup apparatus capable of attaining power saving, suppression of artifact of an obtained image, and reduction of a period of time from when irradiation of a radiant ray is terminated to when the image is obtained may be provided.

Next, examples of the amplification unit, the S/H unit, and the MPX unit included in each of the readout circuits 104 of the signal processors 103 according to this exemplary embodiment will be described with reference to FIG. 1B.

In the amplification units AMP, integrator amplifiers each of which includes an operation amplifier A which amplifies a difference between a signal output to a corresponding one of the signal lines SIG and a reference potential Vref, an integrating capacitance Cf, and a reset switch RC which resets the integrating capacitance (or capacitor) Cf are provided as amplification circuits for individual signal lines SIG. The integrator amplifiers may change amplification factors by changing values of the integrating capacitances Cf. Signals output to the signal lines SIG are supplied to inversion input terminals of the operation amplifiers A and the reference voltage Vref is supplied to non-inversion input terminals of the operation amplifiers A. In each of the amplification circuits, the integrating capacitance Cf and the reset switch RC are connected to each other in parallel between the non-inversion input terminal of the operation amplifier A and an output terminal of the operation amplifier A. The reset switch RC may be controlled by the control signal ΦR supplied from the controller 107. The S/H unit may include a plurality of S/H circuits corresponding to the individual columns. An S/H circuit for a certain column may include a plurality of switches (SHON, SHOS, SHEN, and SHES) and a plurality of capacitances (Chon, Chos, Chen, and Ches). The switch SHOS and the capacitance Chos constitute an S/H circuit for odd-row signals and the switch SHON and the capacitance Chon constitute an S/H circuit for odd-row noise. Furthermore, the switch SHES and the capacitance Ches constitute an S/H circuit for even-row signals and the switch SHEN and the capacitance Chen constitute an S/H circuit for even-row noise. The switches SHON, SHOS, SHEN, and SHES may be controlled by control signals ΦSHON, ΦSHOS, ΦSHEN, and ΦSHES, respectively, supplied from the controller 107. The MPX unit includes switches provided for individual S/H circuits. The MPX unit illustrated in FIG. 1B performs parallel/serial conversion on noise signals of the integrator amplifiers using noise switches (MSON and MSEN) and perform parallel/serial conversion on signals which have been output from the pixels P and which have been amplified by the integrator amplifiers using signal switches (MSOS and MSES). The MPX unit is controlled by a control signal ΦMPX supplied from the controller 107. The noise switches are electrically connected to a noise buffer amplifier Bn and the signal switches are electrically connected to a signal buffer amplifier Bs. The A/D converter ADC is a differential A/D converter electrically connected to the noise buffer amplifier Bn and the signal buffer amplifier Bs. The amplification unit AMP, the S/H unit, the MPX unit, and the A/D converter perform signal processing, that is, amplification, S/H, CDS, MPX, and A/D conversion, respectively. The control signal ΦPM may be supplied from the controller 107 to the amplification unit AMP and the A/D converter.

Next, operations of the radiation image pickup apparatus 100 will be described with reference to FIGS. 1A and 1B and FIG. 2. FIG. 2 is a timing chart illustrating operations of the radiation image pickup apparatus 100 according to the exemplary embodiment. An operation K represents an initialization operation in which a conductive voltage is supplied to the driving lines G from the first row to the last row in arbitrary order so that the switch elements T are brought to a conductive state and the reset switches RC are brought to a conductive state, and accordingly, the conversion elements S are initialized for individual rows. An operation W represents a waiting operation in which a conductive voltage is not supplied to any of the driving lines G and a non-conductive state of the switch elements T of all the pixels P are maintained. An operation Wx represents an accumulating operation performed in a period of time set in accordance with irradiation time of a radiant ray. In the operation Wx, a conductive voltage is not supplied to any of the driving lines G, the switch elements T of all the pixels P are maintained in a non-conductive state, and electric signals are accumulated in all the pixels P. An operation Wd represents a preparation operation for reducing variation of the supply states of the operating voltages of the signal processors 103 and variation of the values of the operating voltages. The operation Wd is performed when the controller 107 operates the signal processors 103 in a state in which the pixel array 101 is not driven. An operation H represents an output operation for outputting digital signals in accordance with electric signals of the pixels P. The operation H is performed when the controller 107 operates the signal processors 103 in a state in which the driving unit 102 drives the pixel array 101.

When the control signal ΦPM is in a low state as illustrated in FIG. 2, a bias potential is supplied from the bias power source Vs to the conversion elements S but an operating voltage is not supplied from the power source unit 106 to the amplification units AMP and the A/D converters ADC. This state is referred to as a first power consumption state. The first power consumption state of the present invention is not limited to this. In a case where the control signal ΦPM is supplied from the controller 107 to the power source unit 106 as described above, the following state is obtained. When the control signal ΦPM is in a low state, an operating voltage is supplied from the power source unit 106 to the amplification units AMP and the A/D converters ADC, but the power consumption of the amplification units AMP and the A/D converters ADC is low. Each of the amplification units AMP includes a current control mechanism (not illustrated) which controls an amount of current supplied to the operation amplifiers A through operating-voltage input terminals (not illustrated) of the operation amplifiers A, for example. When the control signal ΦPM is in the low state, the current control mechanism reduces the current supplied to the operation amplifiers A so that power consumption of the amplification unit AMP becomes low. Furthermore, each of the A/D converters ADC includes a current control mechanism (not illustrated) which controls an amount of current supplied to a comparator (not illustrated) used by the A/D converter ADC through an operating-voltage input terminal (not illustrated) of the comparator, for example. When the control signal ΦPM is in the low state, the current control mechanism reduces current supplied to the comparator so that power consumption of the A/D converter ADC becomes low. The current control mechanism may be configured by a current mirror circuit and a circuit capable of changing an amount of current supplied to the current mirror circuit. In the first power consumption state, the controller 107 causes the radiation image pickup apparatus 100 to perform the initialization operation K. Thereafter, the controller 107 causes the radiation image pickup apparatus 100 to perform the waiting operation W. In the example illustrated in FIG. 2, the radiation image pickup apparatus 100 alternately performs the initialization operation K and the waiting operation W until a radiant ray is irradiated to the pixel array 101. Thereafter, the controller 107 causes the radiation image pickup apparatus 100 to perform the accumulating operation Wx. In the accumulating operation Wx, a radiant ray is irradiated to the pixel array 101 and electric signals corresponding to the radiant ray are accumulated in the pixels P.

After the accumulating operation Wx, the controller 107 brings the control signal ΦPM to a high state and causes the power source unit 106 to supply an operating voltage to the amplification units AMP and the A/D converters ADC. This state is referred to as a second power consumption state in which power consumption is higher than that of the first power consumption state. The second power consumption state of the present invention is not limited to this. In a case where the control signal ΦPM is supplied from the controller 107 to the signal processors 103 as described above, the following state is obtained. When the control signal ΦPM is in a high state, power consumption of the amplification units AMP and the A/D converters ADC is high. Each of the amplification units AMP includes a current control mechanism (not illustrated) which controls an amount of current supplied to the operation amplifiers A through the operating-voltage input terminals (not illustrated) of the operation amplifiers A. When the control signal ΦPM is in the high state, the current control mechanism increases the current supplied to the operation amplifiers A so that power consumption of the amplification unit AMP becomes high. Furthermore, each of the A/D converters ADC includes a current control mechanism (not illustrated) which controls an amount of current supplied to the comparator (not illustrated) used by the A/D converter ADC through the operating-voltage input terminal (not illustrated) of the comparator, for example. When the control signal ΦPM is in the high state, the current control mechanism increases the current supplied to the comparator so that power consumption of the A/D converter ADC becomes high. The controller 107 causes the radiation image pickup apparatus 100 to perform the preparation operation Wd within a predetermined period of time after the radiation image pickup apparatus 100 enters the second power consumption state. After the preparation operation Wd, the controller 107 causes the radiation image pickup apparatus 100 to perform the output operation H. By this, an image (radiographic image) is obtained in accordance with the electric signals of the pixels P corresponding to the radiant ray by the radiation image pickup apparatus 100.

Thereafter, the controller 107 brings the control signal ΦPM to a low state and changes the state of the radiation image pickup apparatus 100 from the second power consumption state to the first power consumption state. Thereafter, the controller 107 causes the radiation image pickup apparatus 100 to perform the initialization operation K and the accumulating operation Wx in this order in a state in which a radiant ray is not irradiated to the pixel array 101. Thereafter, the controller 107 changes the state of the radiation image pickup apparatus 100 from the first power consumption state to the second power consumption state. The controller 107 causes the radiation image pickup apparatus 100 to perform the preparation operation Wd again within a predetermined period of time after the radiation image pickup apparatus 100 enters the second power consumption state. After the preparation operation Wd is performed again, the controller 107 causes the radiation image pickup apparatus 100 to perform the output operation H again. By this, an image (offset image) is obtained in accordance with the electric signals of the pixels P independent from a radiant ray by the radiation image pickup apparatus 100. The offset image is used for correction of the radiographic image.

Figure 3A:
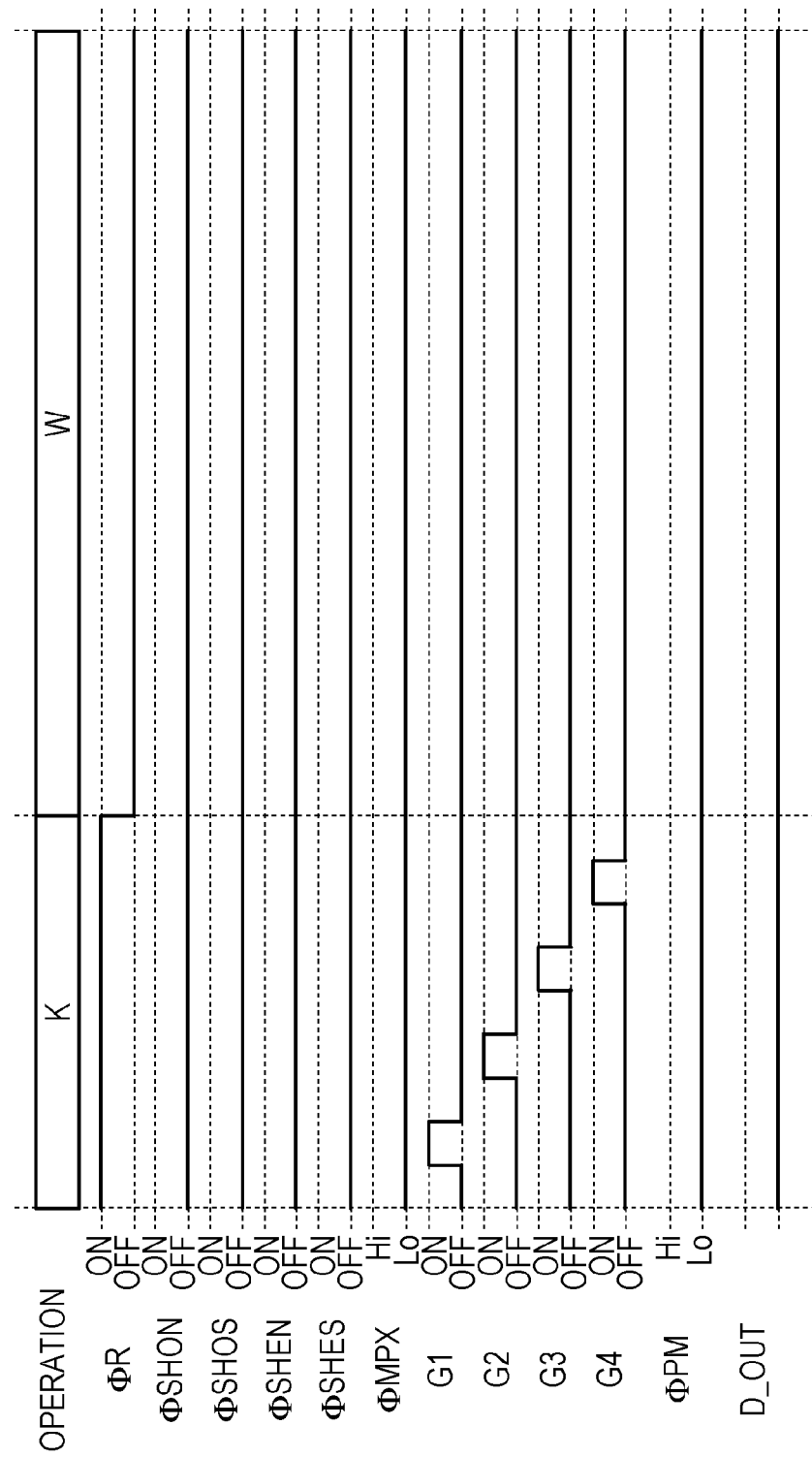

Next, the operations illustrated in FIG. 2 are described in detail with reference to FIGS. 3A to 3C. FIG. 3A is a timing chart illustrating the initialization operation K and the waiting operation W. FIG. 3B is a timing chart illustrating the output operation H. FIG. 3C is a timing chart illustrating the preparation operation Wd.

As illustrated in FIG. 3A, in the initialization operation K, conductive voltages are supplied from the driving unit 102 to the driving lines G from the first row to the last row in arbitrary order in accordance with the control signal ΦDR supplied from the controller 107 to the driving unit 102. Therefore, the switch elements T in the first to last rows are brought to a conductive state (ON) for individual rows in arbitrary order. Meanwhile, the reset switches RC are brought to a conductive state in accordance with the control signal ΦR supplied from the controller 107. Furthermore, in the waiting operation W, a conductive voltage is not supplied from the driving unit 102 to the driving lines G, all the switch elements T are in a non-conductive state (OFF), and the reset switches RC are also in a non-conductive state.

As illustrated in FIG. 3B, the reset switches RC are brought to a conductive state in accordance with the control signal ΦR supplied from the controller 107, and the signal lines SIG and the integrating capacitances Cf are reset. Next, the switches SHON are brought to a conductive state in accordance with the control signal ΦSHON supplied from the controller 107, and signals having offset components of the integrator amplifiers are maintained in the S/H circuits for odd-row noise. Thereafter, a conductive voltage is supplied from the driving unit 102 to the driving line G of the first row in response to the control signal ΦDR supplied from the controller 107 to the driving unit 102. By this, the switch elements T of the pixels P in the first row are brought to a conductive state. Accordingly, the electric signals accumulated in the pixels P in the first row are output to the signal lines SIG in parallel. Thereafter, the switches SHOS are brought to a conductive state in response to the control signal ΦSHOS supplied from the controller 107, and electric signals which have been output to the signal lines SIG and which have been amplified by the integrator amplifiers are stored in the S/H circuits for odd-row signals. By this, the operation is performed on the first row of the pixel array 101. Thereafter, the reset switches RC are brought to a conductive state in response to the control signal ΦR supplied from the controller 107, and the signal lines SIG and the integrating capacitances Cf are reset. Next, the switches SHEN are brought to a conductive state in response to the control signal ΦSHEN supplied from the controller 107, and signals having offset components of the integrator amplifiers are maintained in the S/H circuits for even-row noise. Thereafter, a conductive voltage is supplied from the driving unit 102 to the driving line G of the second row in response to the control signal ΦDR supplied from the controller 107 to the driving unit 102. By this, the switch elements T of the pixels P in the second row are brought to a conductive state. Accordingly, the electric signals accumulated in the pixels P in the second row are output to the signal lines SIG in parallel. Thereafter, the switches SHES are brought to a conductive state in response to the control signal ΦSHES supplied from the controller 107, and electric signals which have been output to the signal lines SIG and which have been amplified by the integrator amplifiers are stored in the S/H circuits for even-row signals. By this, the operation is performed on the second row of the pixel array 101. Here, the controller 107 operates the MPX unit by supplying the control signal ΦMPX so that the signals stored by the operation performed on the first row of the pixel array 101 are output from the S/H circuits for odd-row signals and the S/H circuit for odd-row noise while the operation is performed on the second row of the pixel array 101. These operations are similarly performed on the third row onwards so that an image is obtained by the output operation H of the radiation image pickup apparatus 100. Here, electricity conduction times of the switch elements T in the output operation H in FIG. 3B are substantially the same as periods of time in which the switch elements T are in a conductive state (electricity conduction times) in the initialization operation K illustrated in FIG. 3A. However, the present invention is not limited to this, and the electricity conduction times of the switch elements T in the initialization operation K which are shorter than the electricity conduction times of the switch elements T in the output operation H are preferable since a period of time in which the initialization operation K is performed is reduced.

In the preparation operation Wd illustrated in FIG. 3C, the operation performed for one row in the output operation H illustrated in FIG. 3B is performed a plurality of times except that a conductive voltage is not supplied from the driving unit 102 to any of the driving lines G. Specifically, in the preparation operation Wd, a series of operations including an operation of bringing the reset switches RC to a conductive state, an operation of bringing the switches of the S/H circuits to a conductive state, and an operation of bringing the switches of the MPX units to a conductive state is performed a plurality of times in the second power consumption state. The performance of the series of operations may reduce variation of the states of the operating voltages supplied to the integrator amplifiers and the A/D converters ADC which perform parallel processing on parallel signals output from the pixel array 101 and variation of values of the operating voltages. Furthermore, since the series of operations is performed a plurality of times, a degree of reduction of the variation becomes large and an effect of suppression of artifact of an image becomes larger. Preferably, the series of operations is performed a hundred times or more in a period of time equal to or longer than a hundred times a period of time in which the operation for one row is performed in the output operation H, and more preferably, the series of operations is performed five hundred times or more in a period of time equal to or longer than five hundred times a period of time in which the operation for one row is performed in the output operation H. Furthermore, in the preparation operation Wd of FIG. 3C, the operation performed for one row in the output operation H is more preferably performed a plurality of times except that a conductive voltage is not supplied from the driving unit 102 to any of the driving lines G. The preparation operation Wd of the present invention is not limited to the operation illustrated in FIG. 3C, and other examples will be described with reference to FIGS. 4A to 4C.

Figure 4A:
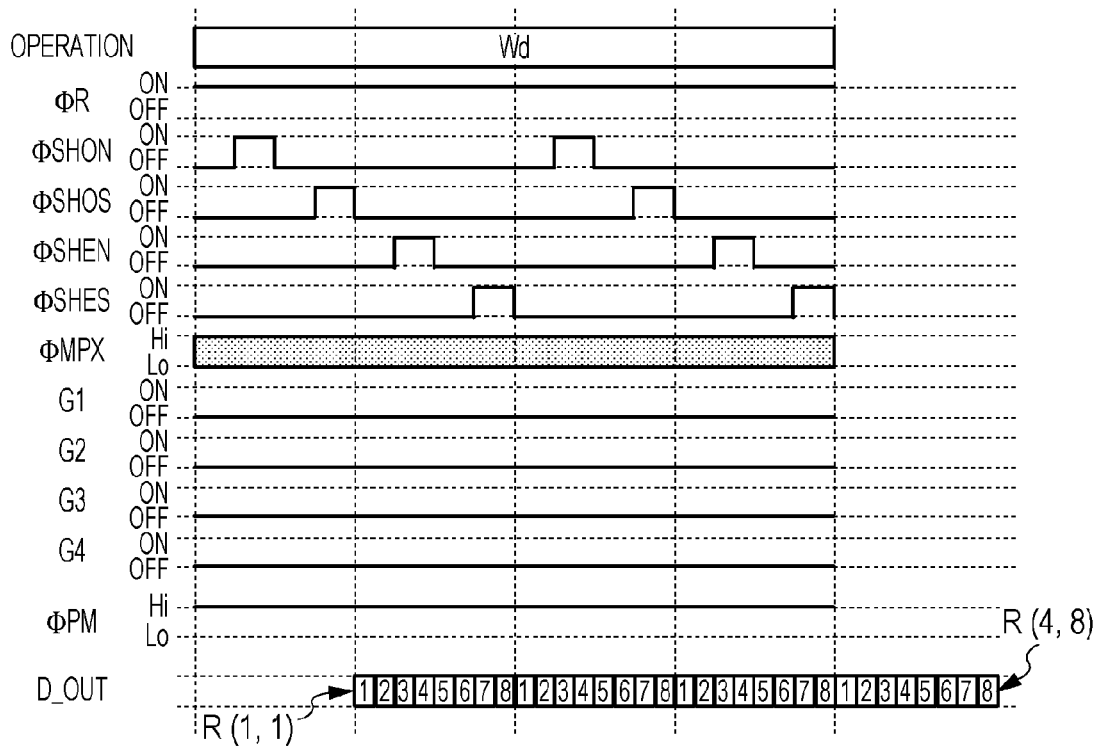
FIGS. 4A to 4C are timing charts illustrating operations of the radiation image pickup apparatus according to the exemplary embodiment.
Figure 4B:
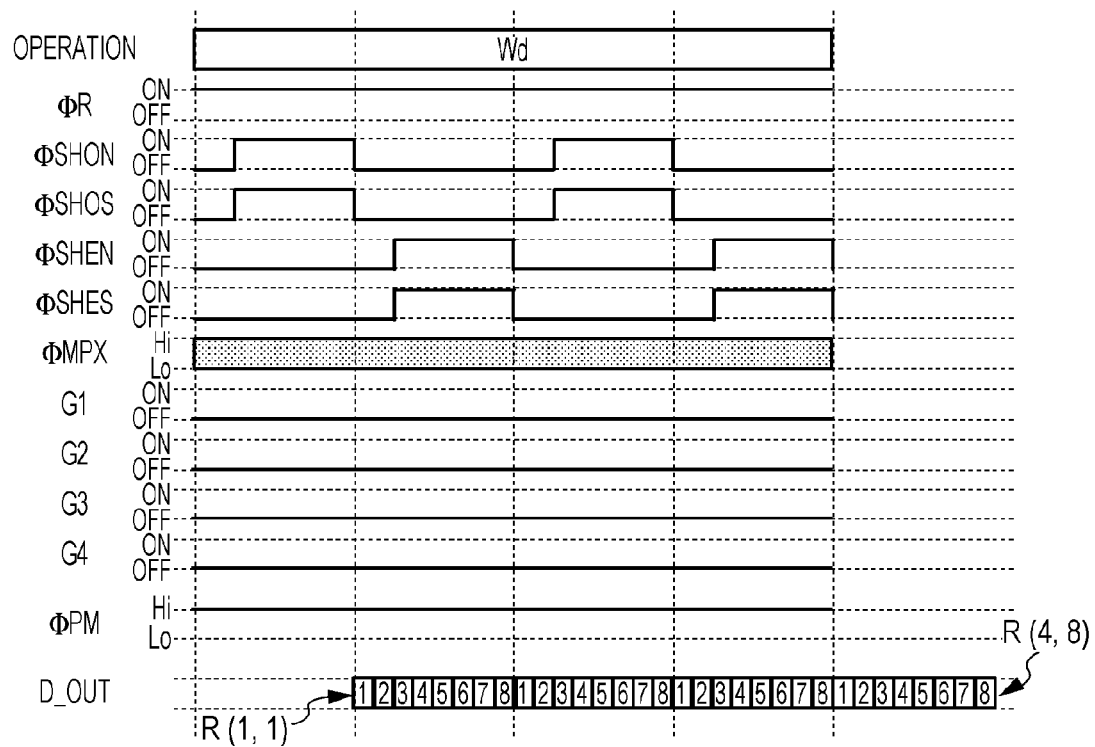
Figure 4C:
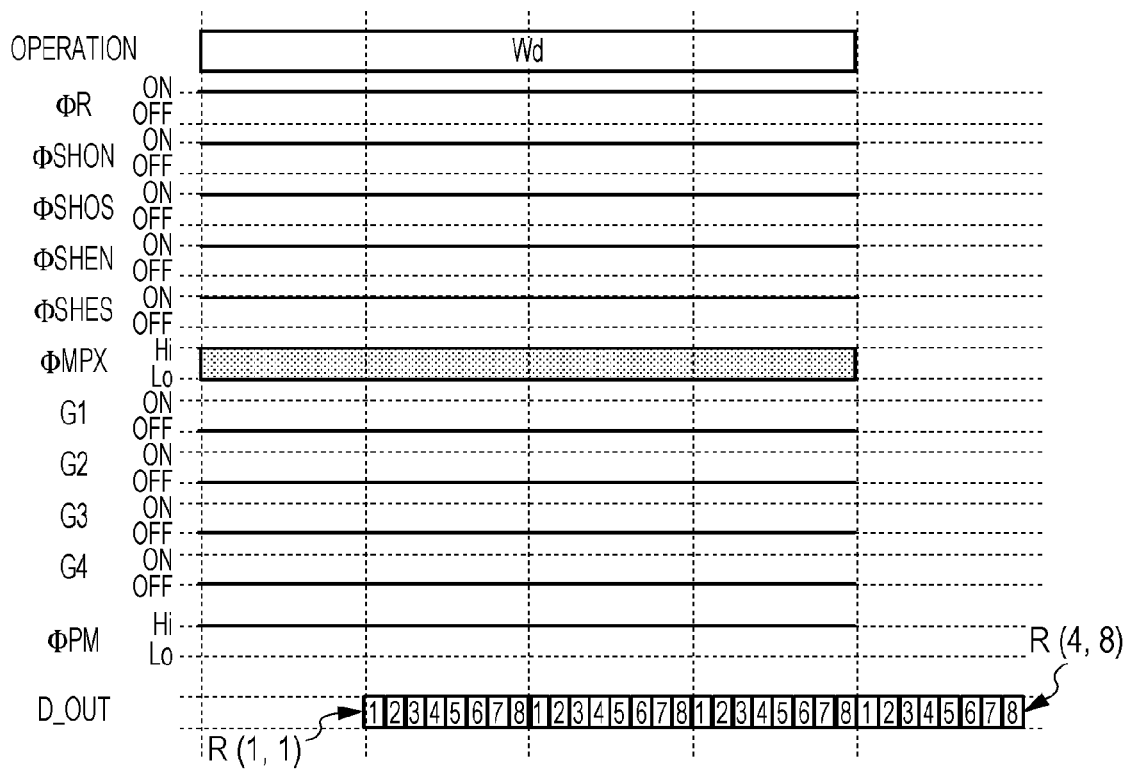

The preparation operation Wd illustrated in FIG. 4A is different from the preparation operation Wd illustrated in FIG. 3C in that the reset switches RC maintain a conductive state. As a period of time in which the reset switches RC are in the conductive state is longer, variation of the integrator amplifiers is further reduced. The preparation operation Wd illustrated in FIG. 4B is different from the preparation operation Wd illustrated in FIG. 4A in that the switches of the S/H circuits for noise and the switches of the S/H circuits for signals are in a conductive state in the same periods and the S/H circuits for noise and the S/H circuits for signals are short-circuited. The preparation operation Wd illustrated in FIG. 4C is different from the preparation operation Wd illustrated in FIG. 4B in that the switches of all the S/H circuits maintain a conductive state.

When the series of operations in each of the preparation operations Wd illustrated in FIG. 3C and FIGS. 4A to 4C is performed, digital signals corresponding to individual columns may be obtained from the A/D converters ADC. Using the digital signals, correction of the image obtained after the preparation operation Wd may be performed. A configuration of the digital signal processing circuit 105 which performs the correction will be described with reference to FIG. 5A.

FIG. 5A is a block diagram illustrating correction units 500 included in the digital signal processing circuits 105. Each of the correction units 500 includes a selection circuit 501, a first storage unit 502, a second storage unit 503, and an arithmetic processing unit 504. The selection circuit 501 selects a digital signal output from a corresponding one of the readout circuits 104 in the preparation operation Wd so as to transmit the digital signal to the first storage unit 502 and selects a digital signal output from the corresponding one of the readout circuits 104 in the output operation H so as to transmit the digital signal to the second storage unit 503. The first storage unit 502 stores the digital signal output from the corresponding one of the readout circuits 104 in the preparation operation Wd. The second storage unit 503 stores the digital signal output from the corresponding one of the readout circuits 104 in the output operation H. The arithmetic processing unit 504 performs arithmetic processing using the digital signal stored in the first storage unit 502 and the digital signal stored in the second storage unit 503. In the example of FIG. 5A, the correction units 500 are provided for individual A/D converters ADC. The arithmetic processing performed by the arithmetic processing unit 504 will be described hereinafter with reference to concept diagrams illustrated in FIGS. 5B and 5C.

FIG. 5B is a concept diagram illustrating a first example of the arithmetic processing performed by the arithmetic processing unit 504. Here, "R(1, 1)" represents a signal corresponding to a first operation of the series of operations in the preparation operation Wd and the integrator amplifier in the first column and "R(1, 2)" represents a signal corresponding to the first operation and the integrator amplifier in the second column. Specifically, assuming that the number of times the series of operations is performed in the preparation operation Wd is denoted by "x", "R(x, n)" represents a signal corresponding to an x-th operation of the series of operations in the preparation operation Wd and an integrator amplifier in an n-th column. Hereinafter, a signal output in the preparation operation Wd is referred to as a first signal. Furthermore, "S(1, 1)" represents a signal corresponding to a pixel P in the first row and the first column, and "S(1, 2)" represents a signal corresponding to a pixel P in the first row and the second column. Assuming that the number of rows of the pixel array 101 is denoted by m and the number of columns of the pixel array 101 is denoted by n, "S(m, n)" represents a signal corresponding to a pixel P in an m-th row and an n-th column. Hereinafter, a signal corresponding to a pixel P is referred to as a second signal. In the example of FIG. 5B, arithmetic processing is performed using the first signal stored in the first storage unit 502 and the second signal stored in the second storage unit 503. Here, the second signals S(m, 1) corresponding to the first column are subjected to a subtraction process using the first signal R(1, 1) corresponding to the first column. Similarly, the second signals S(m, 2), S(m, 3), and S(m, 4) are subjected to the subtraction process using the first signals R(1, 2), R(1, 3), and R(1, 4), respectively. Specifically, the arithmetic processing may be performed to reduce artifact of an image by performing the subtraction process using the first signal and the second signal in the same column.

Furthermore, FIG. 5C is a concept diagram illustrating a second example of the arithmetic processing performed by the arithmetic processing unit 504. In the second example, a subtraction process is performed on a second signal using two first signals obtained by performing the series of operations twice in the preparation operation Wd. The number of times the series of operations is performed is not limited to two in the second example, and the series of operations may be performed a plurality of number of times. Furthermore, a plurality of first signals may be individually used for the subtraction process or may be subjected to an averaging process. Furthermore, only one of the first signals which corresponds to a time point closest to a time point of the second signal may be used.

Although the first signals obtained in the preparation operation Wd in the timing chart illustrated in FIG. 2 are used in the first and second examples of the arithmetic processing, the arithmetic processing performed by the arithmetic processing unit 504 is not limited to this. For example, the controller 107 may cause the signal processors 103 to perform the preparation operation Wd within a period of time corresponding to the output operation H or after the output operation H and a first signal obtained by the preparation operation Wd is used in the arithmetic processing as a modification. Modifications of the arithmetic processing performed by the arithmetic processing unit 504 will be described with reference to FIGS. 6A to 6G.

Figures 6A, 6B, 6C, 6D, 6E, 6F, 6G:
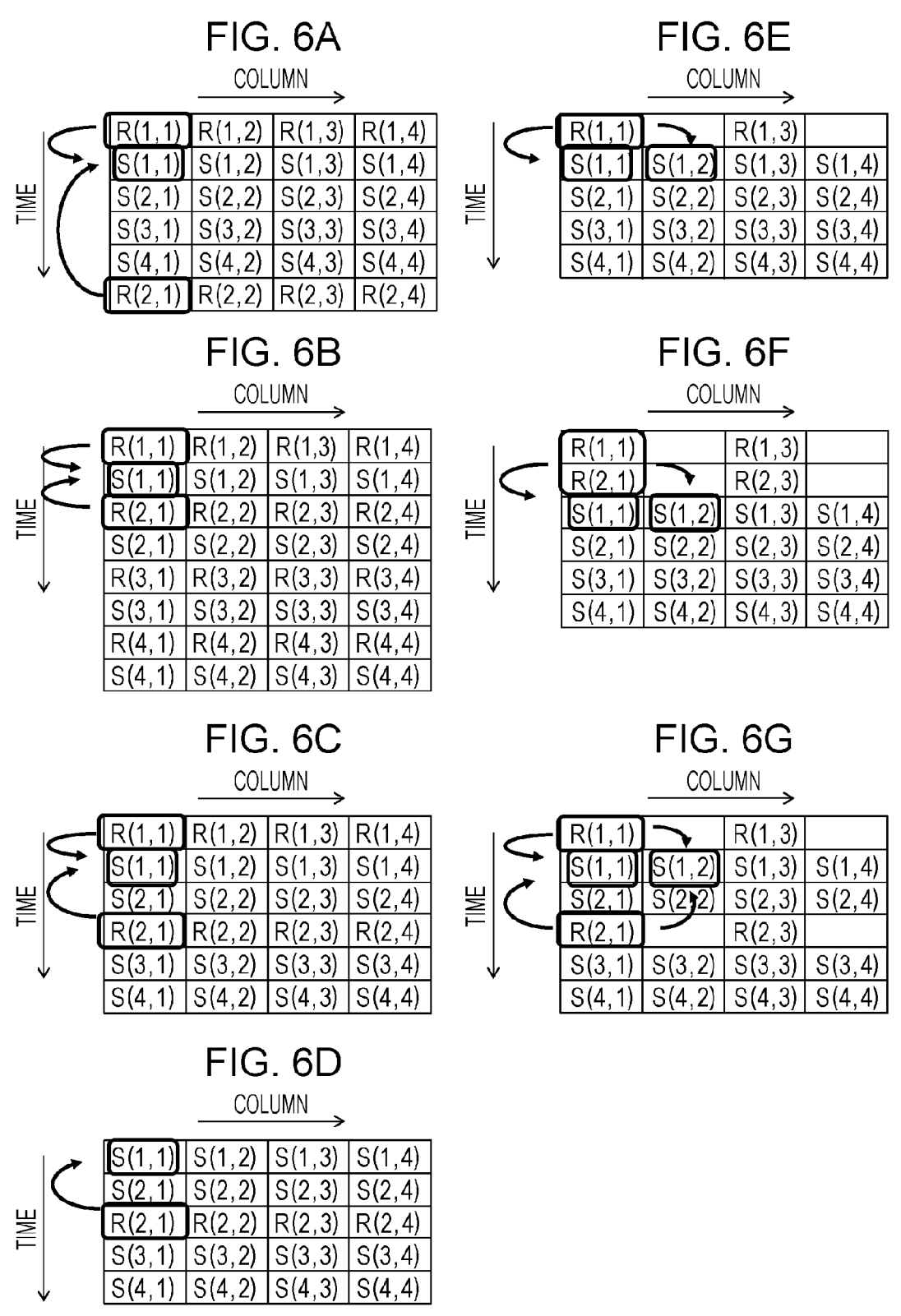

FIG. 6A is a diagram illustrating a first modification in which a second signal is subjected to a subtraction process using a first signal obtained by the series of operations in the preparation operation Wd performed before the output operation H and a first signal obtained by the series of operations in the preparation operation Wd performed after the output operation H. The number of times the series of operations is performed is not limited to two in the first modification, and the series of operations may be performed a plurality of number of times.

FIGS. 6B and 6C are diagrams illustrating second and third modifications. A second signal is subjected to a subtraction process using a first signal obtained by the series of operations in the preparation operation Wd performed before the output operation H and a first signal obtained by the series of operations in the preparation operation Wd performed between the output operations H performed on two of the rows.

The plurality of first signals in the first to third modifications may be individually used for the subtraction process or may be subjected to an averaging process. Furthermore, only one of the first signals which corresponds to a time point closest to a time point of the second signal may be used.

FIG. 6D is a fourth modification in which a second signal is subjected to a subtraction process only using a first signal obtained by the series of operations in the preparation operation Wd performed between the output operations H.

Furthermore, although the subtraction process is performed using the first and second signals in the same column in the examples described above, the arithmetic processing performed by the arithmetic processing unit 504 is not limited to this. As illustrated in FIGS. 6E to 6G, the same first signal or the same first signals may be used in common for columns which share the same A/D converter ADC. By this, artifact of an image caused by variation of the states of the operating voltages supplied to the A/D converters ADC and variation of the values of the operating voltages may be reduced.

Figure 1B:
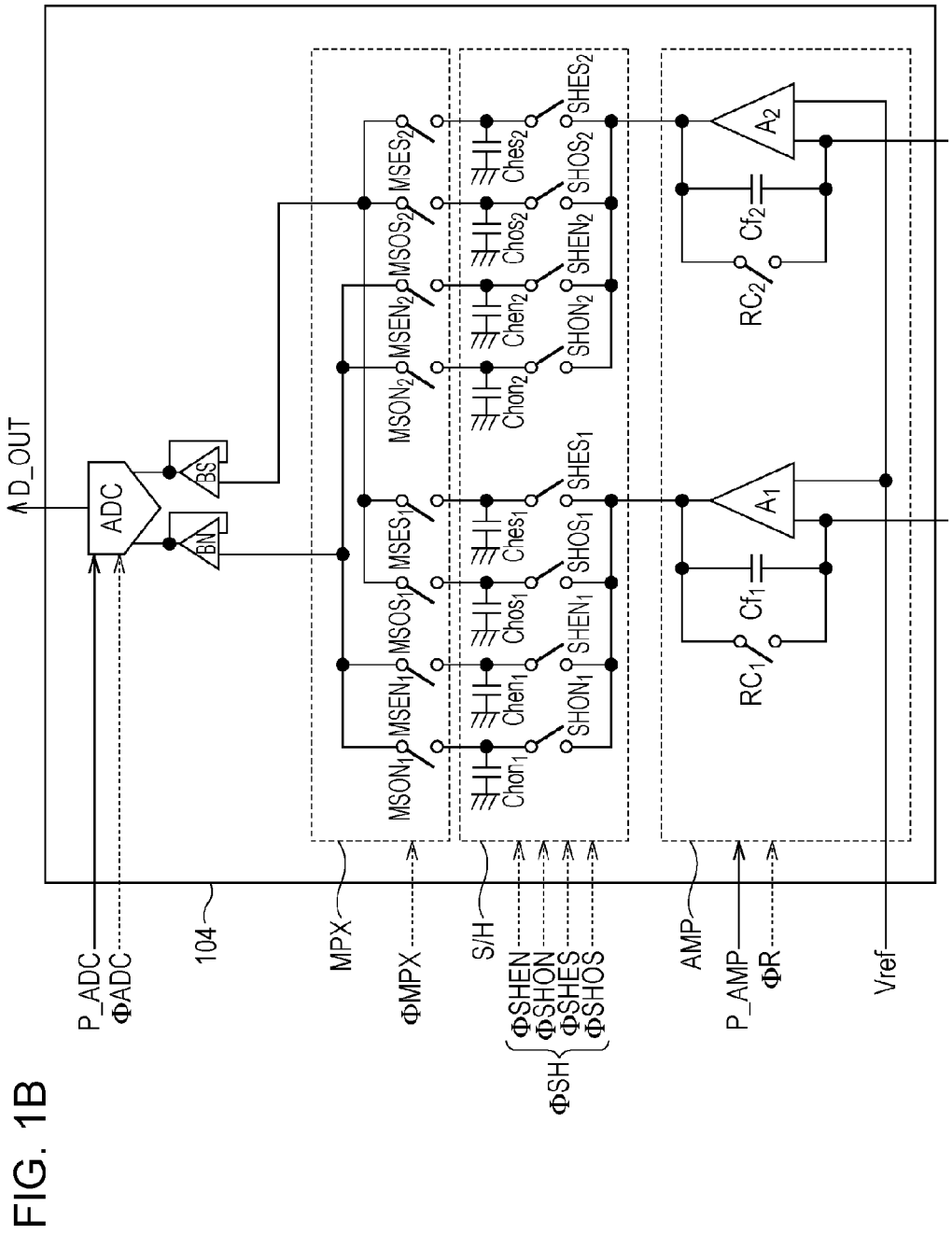

The configuration of the readout circuits 104 included in the signal processors 103 is not limited to the configuration illustrated in FIG. 1B. Another configuration of the readout circuits 104 will be described with reference to FIG. 7.

Figure 7:
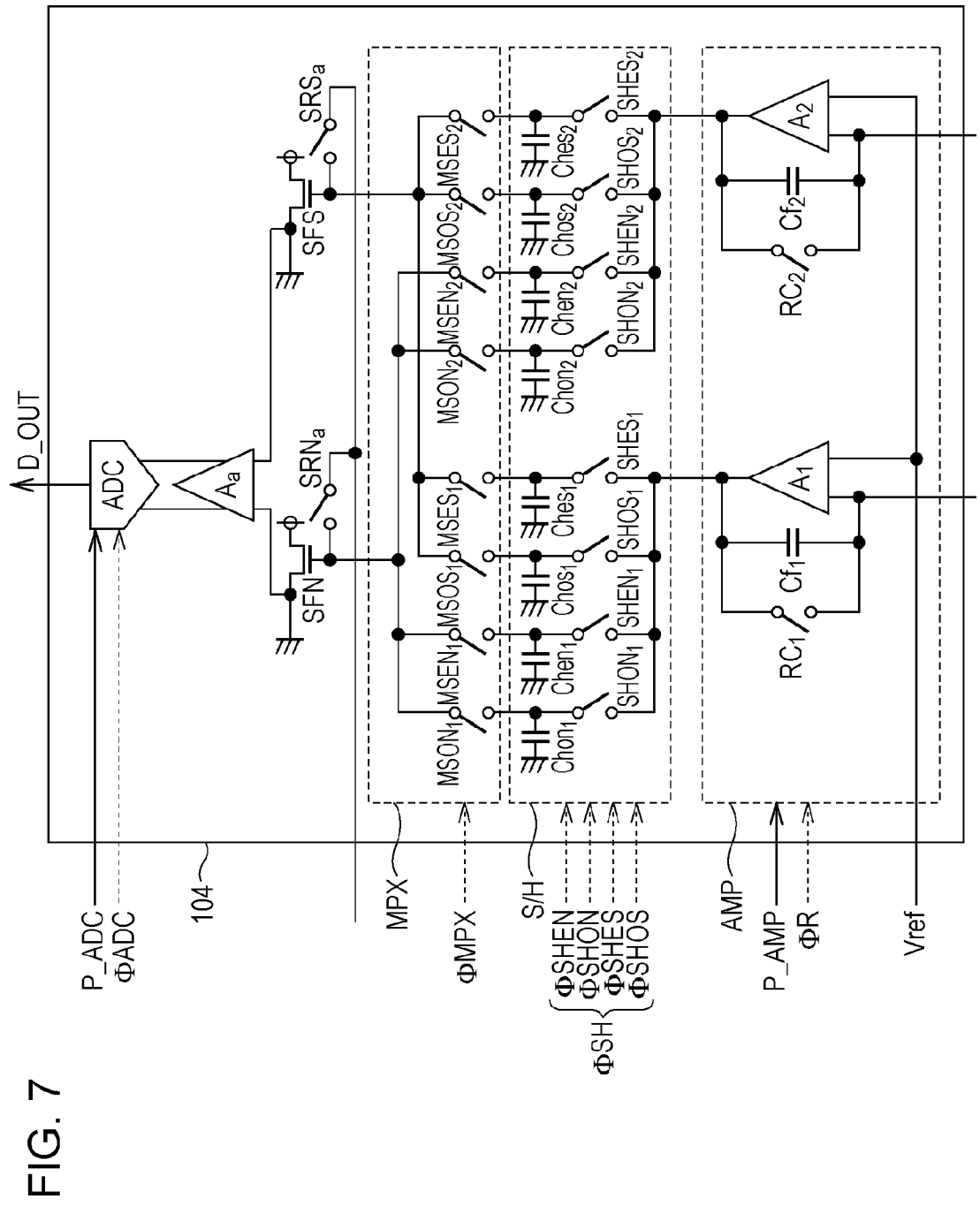
FIG. 7 is an equivalent circuit diagram illustrating another configuration of the radiation image pickup apparatus according to the exemplary embodiment.

The readout circuit 104 illustrated in FIG. 7 includes a source follower buffers SFS and SFN and a fully-differential amplifier Aa instead of the buffer amplifiers Bs and Bn. Furthermore, the readout circuit 104 includes an input reset switch SRS which resets an input of the source follower buffer SFS and an input reset switch SRN which resets an input of the source follower buffer SFN. In this configuration, instead of the first signals in the examples of FIGS. 5B and 5C and FIGS. 6A to 6G, a digital signal obtained by the A/D converter ADC when the source follower buffers SFS and SFN are reset using the input switches SRS and SRN may be used.

Figure 8A:
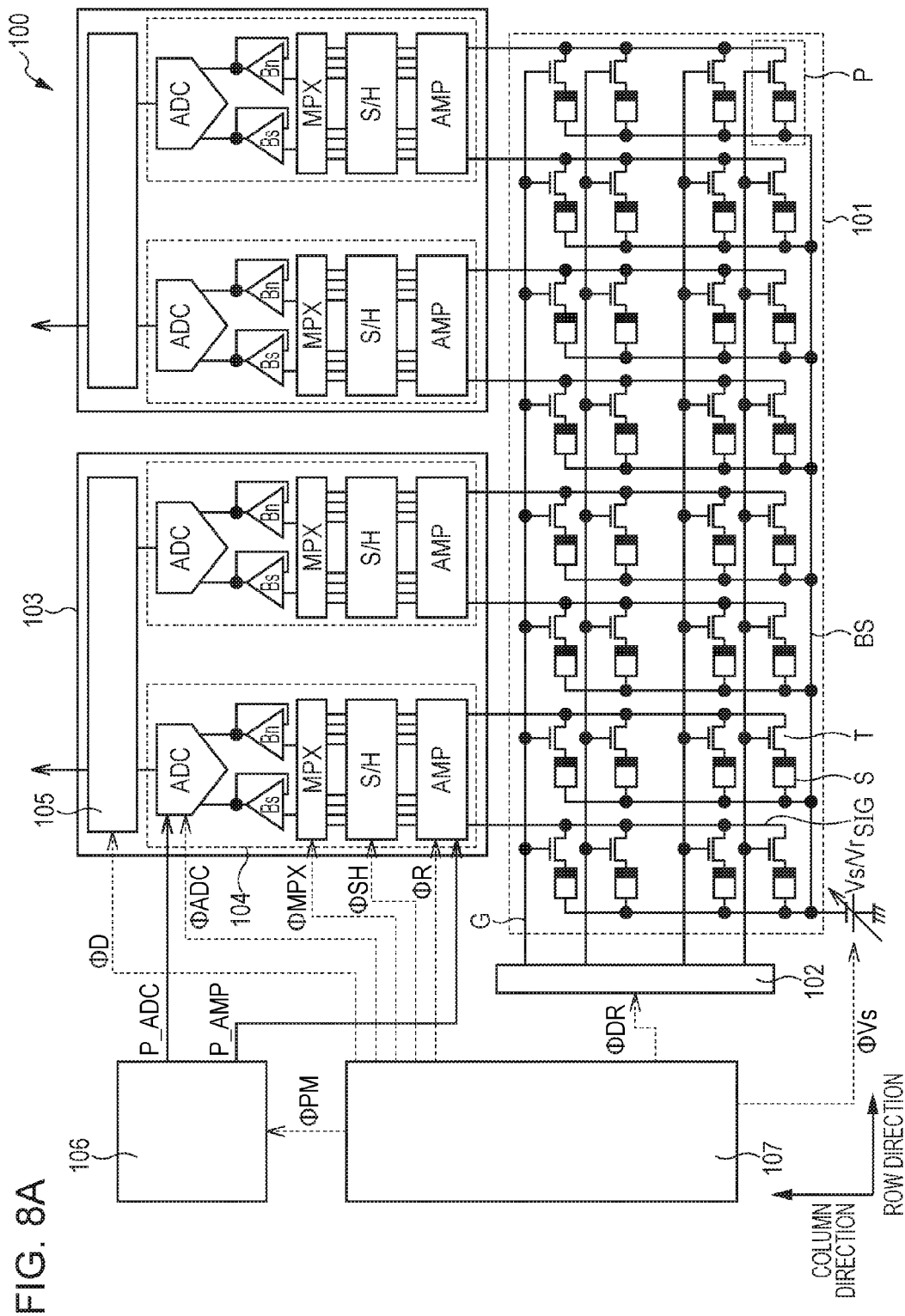
FIG. 8A is an equivalent circuit diagram illustrating a further configuration of the radiation image pickup apparatus according to the exemplary embodiment and FIG. 8B is a timing chart illustrating an operation of the radiation image pickup apparatus according to the exemplary embodiment.
Figure 8B:
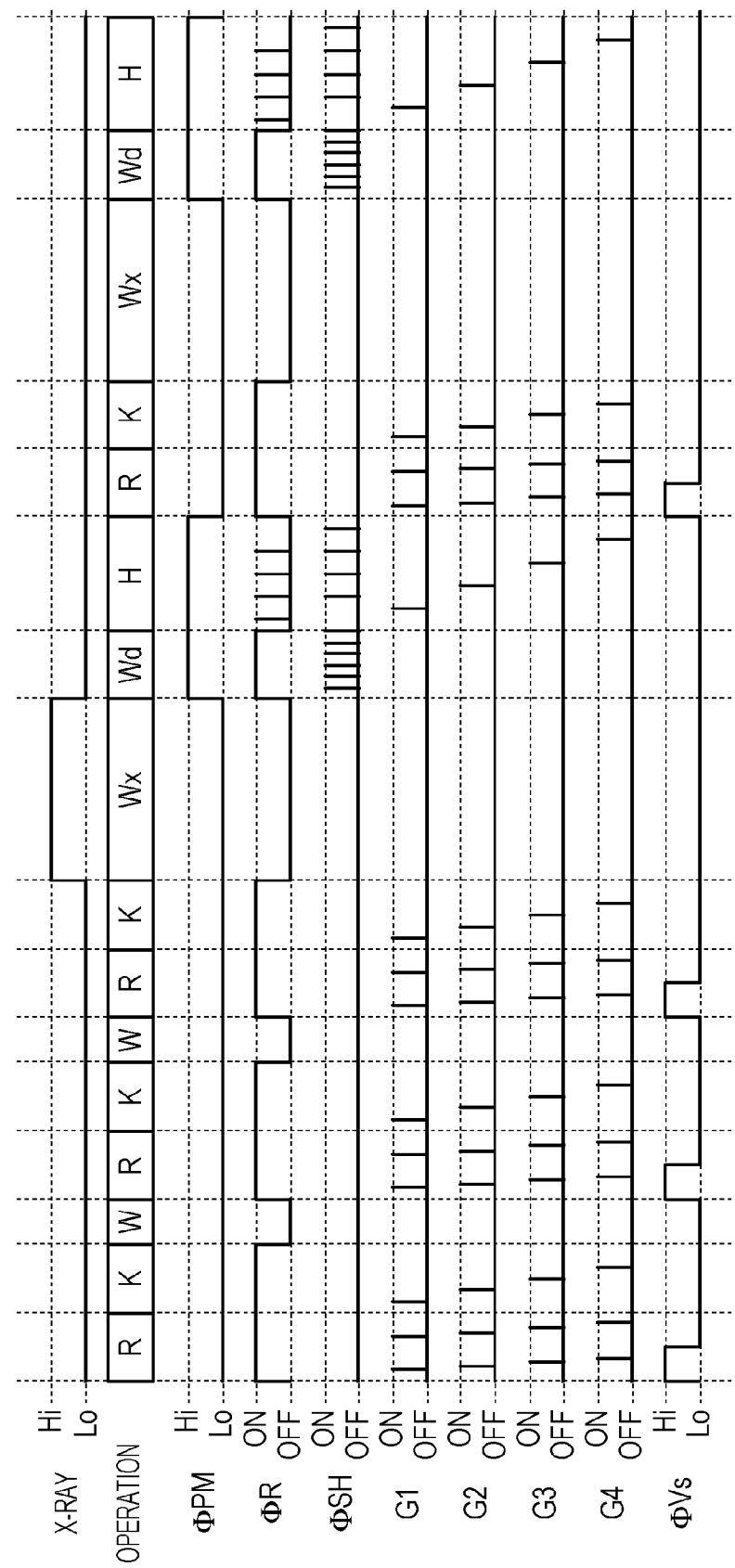

Furthermore, although the case where the PIN photodiodes are used as the conversion elements S is described, the radiation image pickup apparatus of the present invention is not limited to this. For example, as illustrated in FIG. 8A, an MIS conversion element such as an MIS photoelectric conversion element which is a typical MIS conversion element may be used. When the MIS conversion element is used, a variable power source capable of supplying a potential Vr for refreshing the MIS conversion element is preferably used as a bias power source. When the MIS conversion element is used, operation of a radiation image pickup apparatus illustrated in FIG. 8B is different from the operation illustrated in FIG. 2 in that a refresh operation R is performed before the individual initialization operations K. Refresh of an MIS conversion element and a refresh operation are disclosed in Japanese Patent Laid-Open No. 2012-204964.

Figure 9A:
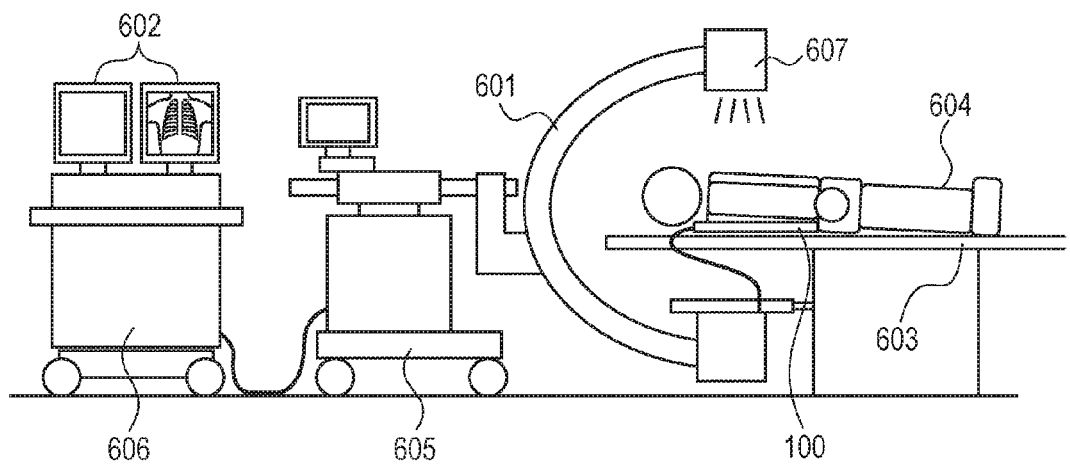
FIGS. 9A and 9B are diagrams illustrating radiation image pickup systems using the radiation image pickup apparatus according to the exemplary embodiment.

Next, an example of application of the present invention to a movable radiation image pickup system will be described. FIG. 9A is a concept diagram illustrating a radiation image pickup system using a portable radiation image pickup apparatus capable of performing fluoroscopic imaging and still-image capturing. In FIG. 9A, an example in which the radiation image pickup apparatus 100 is detached from a C-shaped arm 601 and image capturing is performed using a radiation generation device 607 disposed in the C-shaped arm 601 is illustrated. Here, the C-shaped arm 601 holds the radiation generation device 607 and the radiation image pickup apparatus 100. A display unit 602 displays image data obtained by the radiation image pickup apparatus 100, and a subject 604 is placed on a bed 603. Furthermore, use of a wagon 605 realizes mobility of the radiation generation device 607, the radiation image pickup apparatus 100, and the C-shaped arm 601, and a mobile control device 606 is capable of controlling the radiation generation device 607, the radiation image pickup apparatus 100, and the C-shaped arm 601. The control device 606 including a control computer may perform image processing on an image signal obtained by the radiation image pickup apparatus 100 and transmit the image signal to the display unit 602 or the like. Furthermore, image data generated by the image processing performed by the control device 606 may be transferred to a remote location by a transmission unit such as a telephone line. Accordingly, display in a remote location such as a doctor room is enabled or storage in a storage unit such as an optical disc is enabled, and a doctor in the remote location may make a diagnosis. Furthermore, transmitted image data may be recorded in a film by a film processor. A portion of or entire configuration of the controller 107 of the present invention may be included in the radiation image pickup apparatus 100 or may be included in the control device 606.

Figure 9B:
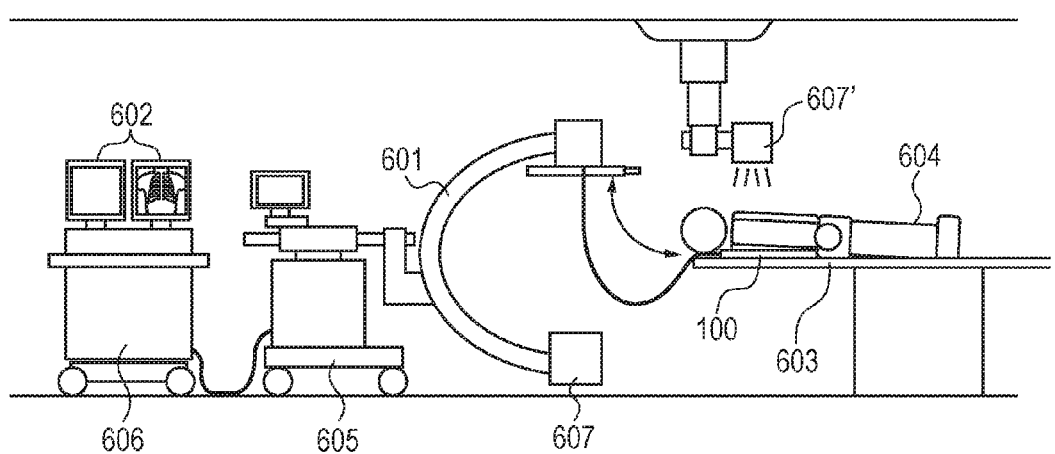

FIG. 9B is a diagram illustrating a radiation image pickup system using a portable radiation image pickup apparatus capable of performing fluoroscopic imaging and still-image capturing. In FIG. 9B, an example in which the radiation image pickup apparatus 100 is detached from the C-shaped arm 601 and image capturing is performed using a radiation generation device 607' which is different from the radiation generation device 607 and which is disposed in the C-shaped arm 601 is illustrated.

Note that the embodiment of the present invention is realized when a computer executes programs, for example. Furthermore, a unit which supplies the programs to the computer including a computer readable recording medium such as a CD-ROM which records the programs or a transmission medium such as the Internet which transmits the programs may be employed as an embodiment of the present invention. Furthermore, the programs may be employed as an embodiment of the present invention. The programs, the recording medium, the transmission medium, and the program product described above are included in the scope of the present invention. Furthermore, an invention constituted by a combination which is easily imaginable according to the embodiments is also included in the scope of the present invention.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-053597, filed Mar. 15, 2013, which is hereby incorporated by reference herein in its entirety.

What is claimed is:
1. A radiation image pickup apparatus comprising:
a pixel array including a plurality of pixels arranged to form a plurality of columns and a plurality of rows and configured to convert a radiant ray into analog signals, the plurality of pixels each including a conversion element configured to convert a radiant ray into a charge and a switch element configured to output an analog signal according to the charge;
a driving unit configured to drive the pixel array so as to bring the switch elements of the plurality of pixels from a non-conductive state into a conductive state on a column-by-column basis so that the analog signals are output from the plurality of pixels in parallel on the column-by-column basis;

signal processors configured to output serial digital signals obtained in accordance with the analog signals output from the pixel array in parallel, the signal processors including a plurality of readout circuits, the plurality of readout circuits each including a plurality of amplification circuits configured to amplify the analog signals output from the pixel arrays in parallel, a plurality of S/H (sample-and-hold) circuits configured to sample and hold the analog signals amplified by the plurality of amplification circuits in parallel, a multiplexer unit configured to convert the analog signals sampled and held by the plurality of S/H circuits in parallel into serial analog signals, and an A/D converter configured to convert the serial analog signals converted by the multiplexer into the serial digital signals, a radiation image being obtained based on the serial digital signals; and a controller configured to control the driving unit and the signal processors, wherein, after irradiation of a radiant ray to the pixel array is terminated, the controller is configured to cause the signal processors to enter a second power consumption state in which power consumption is higher than power consumption of a first power consumption state, and to cause the signal processors to perform a preparation operation for operating the plurality of amplification circuits, the plurality of S/H circuits, the multiplexer and the A/D converter, without causing the driving unit to drive the pixel array, after the signal processors enter the second power consumption state, and to cause the driving unit to drive the pixel array and the signal processors to output the serial digital signals after the signal processors are caused to perform the preparation operation.

2. The radiation image pickup apparatus according to claim 1, wherein
each of the amplification circuits includes an integrator amplifier including an operation amplifier, an integrating capacitance, and a reset switch, and
the controller operates the reset switches of the amplification circuits as the preparation operation.

3. The radiation image pickup apparatus according to claim 2, wherein
each of the S/H circuits includes S/H circuits for signals which hold signals that have been output from the pixels and have been amplified by the amplification circuits, and S/H circuits for noise which hold signals corresponding to offset components of the amplification circuits, and
the controller operates the S/H circuits for signals and the S/H circuits for noise as the preparation operation.

4. The radiation image pickup apparatus according to claim 3,
the controller controls the signal processors so that, while the reset switches are in a conductive state, the S/H circuits for noise are operated, the S/H circuits for signals are operated after the S/H circuits for noise are operated, and the multiplexer units and the A/D converters are operated after the S/H circuits for signals are operated as a series of operations performed.

5. The radiation image pickup apparatus according to claim 3, wherein
the controller controls the signal processors so that the S/H circuits for noise are operated after the reset switches are brought to a conductive state and then to a non-conductive state, the S/H circuits for signals are operated after the S/H circuits for noise are operated, and the multiplexer units and the A/D converters are operated after the S/H circuits for signals are operated as a series of operations performed.

6. The radiation image pickup apparatus according to claim 3, wherein
the controller controls the signal processors so that, while the reset switches are in a conductive state, the S/H circuits for noise and the S/H circuits for signals are short-circuited and the multiplexer units and the A/D converters are operated after the S/H circuits for noise and the S/H circuits for signals are short-circuited as a series of operations performed.

7. The radiation image pickup apparatus according to claim 3, wherein
the controller controls the signal processors so that, while the reset switches is are in a conductive state and the S/H circuits for noise and the S/H circuits for signals are short-circuited, the multiplexer units and the A/D converters are operated as a series of operations performed.

8. The radiation image pickup apparatus according to claim 4, wherein
the controller controls the signal processors so that the series of operations is performed a plurality of times.

9. The radiation image pickup apparatus according to claim 4, wherein
each of the signal processors includes a digital signal processing circuit which processes the serial digital signals output from the A/D converters, and
the digital signal processing circuit causes the driving unit to drive the pixel array and performs a subtraction process on the serial digital signals output from one of the A/D converters using a digital signal output from the A/D converter by the series of operations.

10. The radiation image pickup apparatus according to claim 1, further comprising:
a power source unit configured to supply an operating voltage to the signal processors,
wherein the controller controls the driving unit, the signal processors and the power source unit so that the signal processors enter the second power consumption state from the first power consumption state when the power source unit supplies the operating voltage to the signal processors after irradiation of a radiant ray to the pixel array is terminated and the driving unit drives the pixel array and the signal processors output the serial digital signals when the preparation operation has been performed after the operating voltage is supplied.

11. The radiation image pickup apparatus according to claim 1, wherein
the conversion element includes a photoelectric conversion element which converts light into electric charge and a wavelength conversion element which converts a radiant ray into light having a wavelength detectable by the photoelectric conversion element.

12. A radiation image pickup system comprising:
the radiation image pickup apparatus set forth in claim 1;
a radiation generation device configured to irradiate a radiant ray to the radiation image pickup apparatus; and
a controller configured to control the radiation image pickup apparatus and the radiation generation device.

13. A method for controlling a radiation image pickup apparatus including a pixel array including a plurality of pixels arranged to form a plurality of columns and a plurality of rows and configured to convert a radiant ray into analog signals, the plurality of pixels each including a conversion element configured to convert a radiant ray into a charge and a switch element configured to output an analog signal according to the charge, a driving unit configured to drive the pixel array so as to bring the switch elements of the plurality of pixels from a non-conductive state into a conductive state on a column-by-column basis so that the analog signals are output from the plurality of pixels in parallel on the column-by-column basis, and signal processors configured to output serial digital signals obtained in accordance with the analog signals output from the pixel array in parallel, the signal processors including a plurality of readout circuits, the plurality of readout circuits each including a plurality of amplification circuits configured to amplify the analog signals output from the pixel arrays in parallel, a plurality of S/H (sample-and-hold) circuits configured to sample and hold the analog signals amplified by the plurality of amplification circuits in parallel, a multiplexer unit configured to convert the analog signals sampled and held by the plurality of S/H circuits in parallel into serial analog signals, and an A/D converter configured to convert the serial analog signals converted by the multiplexer into the serial digital signals, a radiation image being obtained based on the serial digital signals, the method comprising:

switching a state of the signal processors after irradiation of a radiant ray to the pixel array from a first power consumption state to a second power consumption state, wherein power consumption of the second power consumption state is higher than power consumption of the first power consumption state;

operating the plurality of amplification circuits, the plurality of S/H circuits, the multiplexer and the A/D converter to perform a preparation operation, without causing the driving unit to drive the pixel array, after the switching; and causing the driving unit to drive the pixel array and outputting the serial digital signals from the signal processors after the preparation operation is performed.

14. A non-transitory computer-readable medium storing a program which executes control of the radiation image pickup apparatus according to claim 13.

15. A radiation image pickup apparatus comprising:
a pixel array including a plurality of pixels arranged to form a plurality of columns and a plurality of rows and configured to convert a radiant ray into analog signals, the plurality of pixels each including a conversion element configured to convert a radiant ray into a charge and a switch element configured to output an analog signal according to the charge;
a driving unit configured to drive the pixel array so as to bring the switch elements of the plurality of pixels from a non-conductive state into a conductive state on a column-by-column basis so that the analog signals are output from the plurality of pixels in parallel on the column-by-column basis;
signal processors configured to output serial digital signals obtained in accordance with the analog signals output from the pixel array in parallel, the signal processors including a plurality of readout circuits, the plurality of readout circuits each including an A/D converter configured to convert the analog signals output from the pixel array in parallel into the serial digital signals, a radiation image being obtained based on the serial digital signals; and
a controller configured to control the driving unit and the signal processors, wherein, after irradiation of a radiant ray to the pixel array is terminated, the controller is configured to cause the signal processors to enter a second power consumption state in which power consumption is higher than power consumption of a first power consumption state, and to cause the signal processors to perform a preparation operation for operating the A/D converter, without causing the driving unit to drive the pixel array, after the signal processors enter the second power consumption state, and to cause the driving unit to drive the pixel array and the signal processors to output the serial digital signals after the signal processors are caused to perform the preparation operation.

16. The radiation image pickup apparatus according to claim 15, wherein
the plurality of readout circuits each further includes a plurality of amplification circuits configured to amplify the analog signals output from the pixel arrays in parallel, a plurality of S/H (sample-and-hold) circuits configured to sample and hold the analog signals amplified by the plurality of amplification circuits in parallel, and a multiplexer unit configured to convert the analog signals sampled and held by the plurality of S/H circuits in parallel into serial analog signals,
the A/D converter converts the serial analog signals converted by the multiplexer into the serial digital signals, and
in the preparation operation, the driving unit is not caused to drive the pixel array and the signal processors are caused to operate the plurality of amplification circuits, the plurality of S/H circuits, the multiplexer and the A/D converter after the signal processors enter the second power consumption state.

17. The radiation image pickup apparatus according to claim 16, wherein
the plurality of amplification circuits each includes an integrator amplifier including an operation amplifier, an integrating capacitance, and a reset switch, and
the controller operates the reset switches of the plurality of amplification circuits in a predetermined time as the preparation operation.

18. The radiation image pickup apparatus according to claim 17, wherein
the plurality of S/H circuits each includes S/H circuits for signals which hold signals that have been output from the pixels and have been amplified by the amplification circuits, and S/H circuits for noise which hold signals corresponding to offset components of the amplification circuits, and
the controller operates the S/H circuits for signals and the S/H circuits for noise as the preparation operation.

19. The radiation image pickup apparatus according to claim 15, further comprising:
a power source unit configured to supply an operating voltage to the signal processors,
wherein the controller controls the driving unit, the signal processors and the power source unit so that the signal processors enter the second power consumption state from the first power consumption state when the power source unit supplies the operating voltage to the signal processors after irradiation of a radiant ray to the pixel array is terminated and the driving unit drives the pixel array and the signal processors output the serial digital signals when the preparation operation has been performed after the operating voltage is supplied.

20. A radiation image pickup system comprising:
the radiation image pickup apparatus set forth in claim 15;

a radiation generation device configured to irradiate a radiant ray to the radiation image pickup apparatus; and a controller configured to control the radiation image pickup apparatus and the radiation generation device.

* * * * *